US011398586B2

(12) United States Patent
Tonkikh et al.

(10) Patent No.: US 11,398,586 B2
(45) Date of Patent: Jul. 26, 2022

(54) LIGHT-EMITTING SEMICONDUCTOR COMPONENT

(71) Applicant: OSRAM OLED GMBH, Regensburg (DE)

(72) Inventors: Alexander Tonkikh, Regensburg (DE); Britta Göötz, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/644,805

(22) PCT Filed: Sep. 3, 2018

(86) PCT No.: PCT/EP2018/073594
§ 371 (c)(1),
(2) Date: Mar. 5, 2020

(87) PCT Pub. No.: WO2019/048370
PCT Pub. Date: Mar. 14, 2019

(65) Prior Publication Data
US 2021/0074893 A1  Mar. 11, 2021

(30) Foreign Application Priority Data
Sep. 6, 2017   (DE) .................. 102017120522.5

(51) Int. Cl.
*H01L 33/00* (2010.01)
*H01L 33/54* (2010.01)
(Continued)

(52) U.S. Cl.
CPC .............. *H01L 33/54* (2013.01); *H01L 33/06* (2013.01); *H01L 33/08* (2013.01); *H01L 33/145* (2013.01);
(Continued)

(58) Field of Classification Search
CPC ....... H01L 33/30; H01L 33/025; H01L 33/54; H01L 33/56; H01L 33/22; H01L 33/145; H01L 33/32
See application file for complete search history.

(56) References Cited

U.S. PATENT DOCUMENTS

2002/0020842 A1* 2/2002 Sasaki ................... H01L 33/145
                                                        257/79
2003/0146444 A1* 8/2003 Onishi .............. H01L 21/02461
                                                        257/85
(Continued)

FOREIGN PATENT DOCUMENTS

DE        10119507 A1    3/2002

OTHER PUBLICATIONS

International Search Report and Written Opinion of the International Searching Authority, dated Nov. 14, 2018, in related International Application No. PCT/EP2018/073594, 12 pages.

*Primary Examiner* — Savitri Mulpuri
(74) *Attorney, Agent, or Firm* — MH2 Technology Law Group LLP

(57) ABSTRACT

A light-emitting semiconductor device (100) comprising a semiconductor layer sequence (1) based on a phosphide and/or arsenide compound semiconductor material system is specified, wherein—the semiconductor layer sequence (1) comprises a light-emitting semiconductor layer (10), which is embodied to emit light during operation of the semiconductor device (100), between a first cladding layer (11) and a second cladding layer (12), and at least a first semiconductor protection layer (13), the first semiconductor protection layer (13) is arranged inside the first cladding layer (11), wherein the first cladding layer is formed as an outer layer, or the first semiconductor protection layer is arranged as an outer layer directly on the first cladding layer (11) on a side remote from the light-emitting semiconductor layer (10), (Continued)

Figure 1:
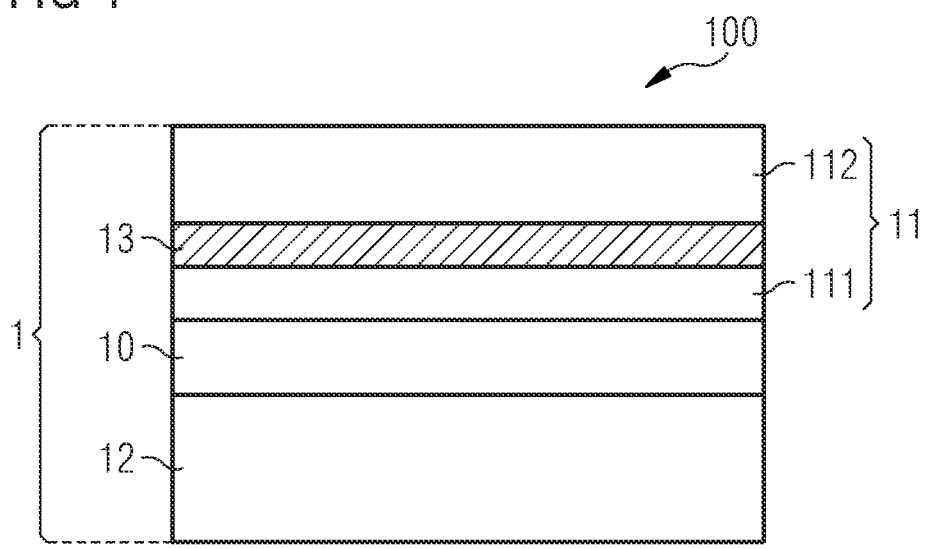

and the first semiconductor protection layer (13) has a lower aluminum content than the first cladding layer.

14 Claims, 3 Drawing Sheets

(51) Int. Cl.
 *H01L 33/56* (2010.01)
 *H01L 33/08* (2010.01)
 *H01L 33/30* (2010.01)
 *H01L 33/14* (2010.01)
 *H01L 33/06* (2010.01)
 *H01L 33/22* (2010.01)
(52) U.S. Cl.
 CPC .............. *H01L 33/22* (2013.01); *H01L 33/30* (2013.01); *H01L 33/56* (2013.01)

(56) References Cited

U.S. PATENT DOCUMENTS

| | | |
|---|---|---|
| 2007/0290216 A1 | 12/2007 | Watanabe |
| 2008/0093612 A1 | 4/2008 | Konno et al. |
| 2008/0135856 A1 | 6/2008 | Moon |
| 2012/0119254 A1 | 5/2012 | Moon et al. |
| 2014/0166975 A1 | 6/2014 | Ito |

* cited by examiner

LIGHT-EMITTING SEMICONDUCTOR COMPONENT

CROSS-REFERENCE TO RELATED APPLICATION(S)

This application is a national stage entry from International Application No. PCT/EP2018/073594, filed on Sep. 3, 2018, and claims priority under 35 U.S.C. § 119 from German Patent Application No. 102017120522.5, filed on Sep. 6, 2017, the entire contents of all of which are incorporated herein by reference.

A light-emitting semiconductor device is specified.

This patent application claims the priority of the German patent application 10 2017 120 522.5, the disclosure content of which is hereby included by reference.

Epitaxially grown semiconductor structures are nowadays used for a variety of applications. In order to generate visible light in the green to red spectral range, mainly epitaxial structures with active zones based on InAlGaP and InAlGaAs semiconductor materials are used. However, it has been shown that, despite measures to increase the light extraction, such as roughening, the efficiency of such components can be low, which may be due, among other things, to the chemical stability of surfaces located near the active zone.

At least one object of particular embodiments is to provide a light-emitting semiconductor device.

This object is achieved by a subject-matter according to the independent claim. Advantageous embodiments and developments of the subject-matter are characterized in the dependent claims, and are also disclosed by the following description and the drawings.

According to at least one embodiment, a light-emitting semiconductor device has a semiconductor layer sequence. The semiconductor layer sequence can be manufactured in particular by an epitaxy method, i.e., by epitaxial growth of semiconductor layers on a growth substrate. Suitable epitaxy methods can be, for example, metal organic vapor phase epitaxy (MOVPE) or molecular beam epitaxy (MBE).

The semiconductor layer sequence comprises at least a light-emitting semiconductor layer which is intended and embodied to emit light during operation of the semiconductor device. The semiconductor layer sequence can be based on a phosphide and/or arsenide compound semiconductor material system, i.e., $In_xAl_yGa_{1-x-y}P$ and/or $In_xAl_yGa_{1-x-y}As$, each with $0 \leq x \leq 1$, $0 \leq y \leq 1$ and $x+y \leq 1$, and can comprise or consist of at least one semiconductor layer or a plurality of semiconductor layers based on such material. The phosphide compound semiconductor material system and the arsenide compound semiconductor material system can be briefly referred to as InAlGaP and InAlGaAs. A semiconductor layer sequence comprising at least a light-emitting semiconductor layer based on InGaAlP can, for example, emit light with one or more spectral components in a green to red wavelength range during operation of the semiconductor device. A semiconductor layer sequence comprising at least a light-emitting semiconductor layer based on InAlGaAs can, for example, emit light with one or more spectral components in a red to infrared wavelength range during operation of the semiconductor device.

The semiconductor layer sequence can be embodied according to the desired functionality of the light-emitting semiconductor device and can, for example, have several light-emitting semiconductor layers instead of the one light-emitting semiconductor layer described here and in the following. Furthermore, the semiconductor layer sequence can comprise at least a first and a second cladding layer, between which the light-emitting semiconductor layer is arranged. Here and in the following, as cladding layers are denoted in particular those semiconductor layers which are usually arranged in a semiconductor layer sequence in the direction of growth on both sides of the light-emitting semiconductor layer and which form a confinement area for charge carriers. Accordingly, the cladding layers have a larger band gap than the light-emitting semiconductor layer in between. The variation of the band gaps of the layers of the semiconductor layer sequence can be achieved by a variation of the phosphide and/or arsenide compound semiconductor material. In particular, the ratio of Ga atoms to Al atoms can lead to a variation of the band gap along with minor variations of the lattice parameters. Particularly preferentially, the first and second cladding layers in the semiconductor layer sequence, which is based on a phosphide and/or arsenide compound semiconductor material system, have a higher aluminum content than the light-emitting semiconductor layer. For example, in light-emitting semiconductor devices having a semiconductor layer sequence based on a phosphide compound semiconductor material system, first and second cladding layers with or made of $Al_{0.25}In_{0.25}P$ or with higher aluminum contents can be advantageous.

The generation of light in the light-emitting semiconductor layer can be based on electroluminescence or photoluminescence. Accordingly, the light-emitting semiconductor device can be an electroluminescent semiconductor device or a photoluminescent semiconductor device. In both cases photons are generated by excitation and recombination of charge carriers, especially electron-hole pairs. In the case of an electroluminescent semiconductor device, the excitation, i.e., the generation of charge carriers in the semiconductor layer sequence, takes place by injecting an electric current in the semiconductor layer sequence. In this case, the light-emitting semiconductor component can be embodied, for example, as a light-emitting diode chip. The current injection is usually carried out through the cladding layers with a larger band gap than the light-emitting semiconductor layer into the light-emitting semiconductor layer, in which the charge carriers can recombine as described, generating photons. In the case of a photoluminescent semiconductor device, the excitation takes place by irradiation of excitation light, for example from an external pump light source, which excitation light can be absorbed in the semiconductor layer sequence and especially in the light-emitting semiconductor layer. Since photons are usually absorbed which have a higher energy than the photons generated by recombination in the light-emitting semiconductor layer, in the case of a photoluminescent semiconductor device it can in particular form a conversion element, also known as an epitaxial converter or epi-converter. As in the case of a semiconductor electroluminescent device, the light-emitting semiconductor layer in a semiconductor photoluminescent device is located between the cladding layers, which have a larger band gap than the light-emitting semiconductor layer, in order to achieve efficient confinement of charge carriers in the light-emitting semiconductor layer. In contrast to electroluminescent semiconductor devices, however, photoluminescent semiconductor devices do not require current spreading layers, which can typically be 1 to 2 μm thick, since no current injection is required and thus no current spreading is necessary. Furthermore, in the case of a photoluminescent semiconductor device, it is usually necessary to remove the growing substrate, especially if it is not or only slightly transparent to the light generated in the light-emitting semiconductor layer or to the excitation light. Epi-converters can therefore be more cost-effective and compact than light-emitting diode chips.

Furthermore, the semiconductor layer sequence can have further semiconductor layers, in particular between the first and second cladding layer of which one can be p-doped and the other n-doped, for example p- and/or n-doped charge carrier transport layers, further undoped and/or p- and/or n-doped confinement, cladding and/or waveguide layers, barrier layers, planarization layers, buffer layers and/or protection layers. In addition, the semiconductor device—can have one or more contact metallizations by means of which the semiconductor layer sequence can be electrically contacted in the case of an electroluminescent semiconductor device.

Furthermore, the semiconductor device can have a substrate, which can be a growth substrate, for example, on which the semiconductor layer sequence has been grown epitaxially. Alternatively, after the growth the semiconductor layer sequence can be transferred to a substrate embodied as a carrier substrate and the growth substrate can be removed. As substrate materials semiconductor materials such as GaAs, GaP, Ge or Si can be suitable. Moreover, it can also be possible that the semiconductor layer sequence is detached from the growing substrate after growing without transferring the semiconductor layer sequence to a carrier substrate, so that the semiconductor device can also be substrateless. As described above, this can be particularly advantageous in the case of a photoluminescent semiconductor device.

According to a further embodiment, the semiconductor layer sequence comprises at least a first semiconductor protection layer. The first semiconductor protection layer can, particularly preferably, be arranged directly on the first cladding layer on a side facing away from the light-emitting semiconductor layer and form an outer layer of the semiconductor layer sequence. In the following, an outer layer is defined here as a semiconductor layer of the semiconductor layer sequence, with which the semiconductor layer sequence ends along the growing direction of the semiconductor layers, i.e., which has a surface facing away from the light-emitting semiconductor layer, the surface forming an outer surface of the semiconductor layer sequence. Alternatively, the first semiconductor protection layer can be arranged inside the first cladding layer, which in this case is formed as the outer layer of the semiconductor layer sequence. For this purpose, the first cladding layer can in particular comprise a first and a second sublayer, between which the first semiconductor protection layer is arranged in direct contact. In particular, the first sublayer can be located between the semiconductor protection layer and the light-emitting semiconductor layer, while the second sublayer is applied to the side of the first semiconductor protection layer facing away from the light-emitting semiconductor layer and thus forms the outside of the semiconductor layer sequence.

In particular, the first cladding layer and the first semiconductor protection layer can comprise and, particularly preferred, be made of semiconductor materials from the same compound semiconductor material system. In other words, the first cladding layer and the first semiconductor protection layer each comprise or are be made of a semiconductor material based on InAlGaP or based on InAlGaAs. Furthermore, the first semiconductor protection layer has a lower aluminum content than the first cladding layer. Semiconductor layers with a high aluminum content can degrade during the procedure of wet chemical process steps and also, for example, during operation in atmospheres containing moisture and/or oxygen, as the high aluminum content can promote oxidation of the semiconductor material. The first semiconductor protection layer having a lower aluminum content than the first cladding layer means that the first cladding layer, or at least a first part of it, can be protected from such degradation by the first semiconductor protection layer applied thereon from the point of view of the light-emitting semiconductor layer. Accordingly, the light-emitting semiconductor layer can also be protected from degradation by the first semiconductor protection layer. In particular, the aluminum content of the first semiconductor protection layer can be selected such that the first semiconductor protection layer is transparent to the light generated by the light-emitting semiconductor layer during operation and is at the same time stable in an environment containing moisture and oxygen. It has proven to be particularly advantageous if the first semiconductor layer has an aluminum content of more than 0% and less than 12%. Furthermore, it can be advantageous if the first semiconductor protection layer has a thickness of greater than or equal to 10 nm and less than or equal to 100 nm. If the semiconductor component has a substrate, the semiconductor layer sequence is arranged on the substrate in particular with a side facing away from the first semiconductor protection layer.

According to a further embodiment, the first semiconductor protection layer is arranged inside the first cladding layer, as described above, wherein the first cladding layer has a roughened surface on an outer side facing away from the light-emitting semiconductor layer. In other words, as described above, the first semiconductor protection layer can be arranged directly between a first and a second sublayer of the first cladding layer, the second sublayer, which forms an outer surface of the first cladding layer and thus an outer surface of the semiconductor layer sequence, having the roughening. The roughening can, for example, be produced by an etching process such as wet chemical etching and thus be an etching structure with regularly or irregularly arranged elevations and depressions. Preferably, the roughening does not extend through the first semiconductor protection layer. Particularly preferably, the roughening extends only up to the first semiconductor protection layer. In other words, the roughening has structures, in particular depressions, with a maximum depth less than or equal to the thickness of the second sublayer of the first cladding layer, so that no channels formed by the roughening reach through the first semiconductor protection layer. In this case, the first semiconductor protection layer can protect the layers beneath the first semiconductor protection layer, as seen from the light-emitting semiconductor layer, from oxidation during the production of the roughening in the first cladding layer. It can also be achieved that the formation of channels or pores through the first cladding layer to the light-emitting semiconductor layer is avoided, thus increasing the stability of the semiconductor device even in an atmosphere containing moisture and/or oxygen.

According to a further embodiment, the roughening has a maximum structure depth of greater than or equal to 200 nm and less than or equal to 1 μm, and particularly preferred of greater than or equal to 500 nm and less than or equal to 700 nm. Accordingly, the second sublayer of the first cladding layer also preferably has a thickness that is greater than or equal to the specified values.

The first semiconductor protection layer can be undoped or have p-doping or n-doping, depending on the embodiment of the light-emitting semiconductor device. Furthermore, the first semiconductor protection layer can have the same doping as the first cladding layer.

According to a further embodiment, the semiconductor layer sequence has a second semiconductor protection layer on a side of the light-emitting semiconductor layer opposite the first semiconductor protection layer. This can be particularly advantageous if the semiconductor component is substrate-free. In particular, the second semiconductor protection layer can be arranged, as a further outer layer, directly on the second cladding layer on a side facing away from the light-emitting semiconductor layer. The second semiconductor protection layer can have one or more of the features described in connection with the first semiconductor protection layer. In particular, the first and second semiconductor protection layer can be based on the same semiconductor material. Depending on the embodiment of the semiconductor device, the first and second semiconductor protection layers can be the same or different with regard to doping.

In the semiconductor device described here, by additionally incorporating at least the first semiconductor protection layer on one side of the light-emitting semiconductor layer or also the first and second semiconductor protection layers on different sides of the light-emitting semiconductor layer near or on the outer sides of the semiconductor layer sequence, it is possible to achieve an advantageous result that the stability of the semiconductor layer sequence and thus of the semiconductor component in environments containing moisture and/or oxygen can be increased with respect to oxidative aging processes, since the composition of the semiconductor protection layer(s), which is different from that of the cladding layers, is more resistant to damaging environmental conditions. As a result, it can be possible to achieve improved luminescence properties in semiconductor devices embodied as light-emitting diode chips and, in particular, also in semiconductor devices embodied as epi-converters.

Figure 2:
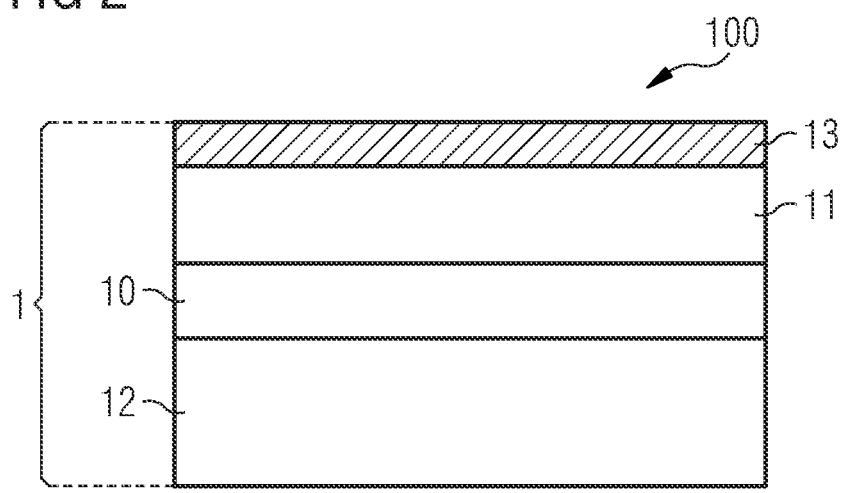
Figure 3:
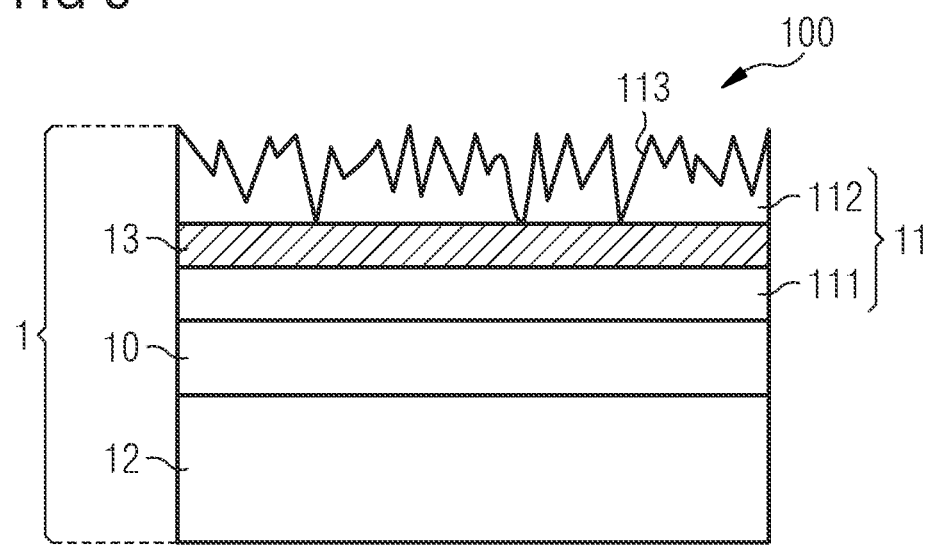
Figure 4:
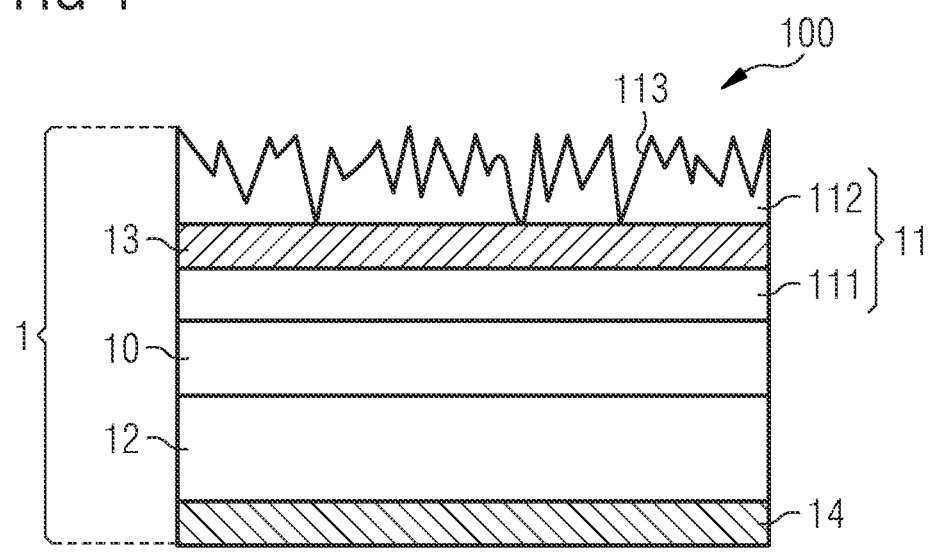
Figure 5:
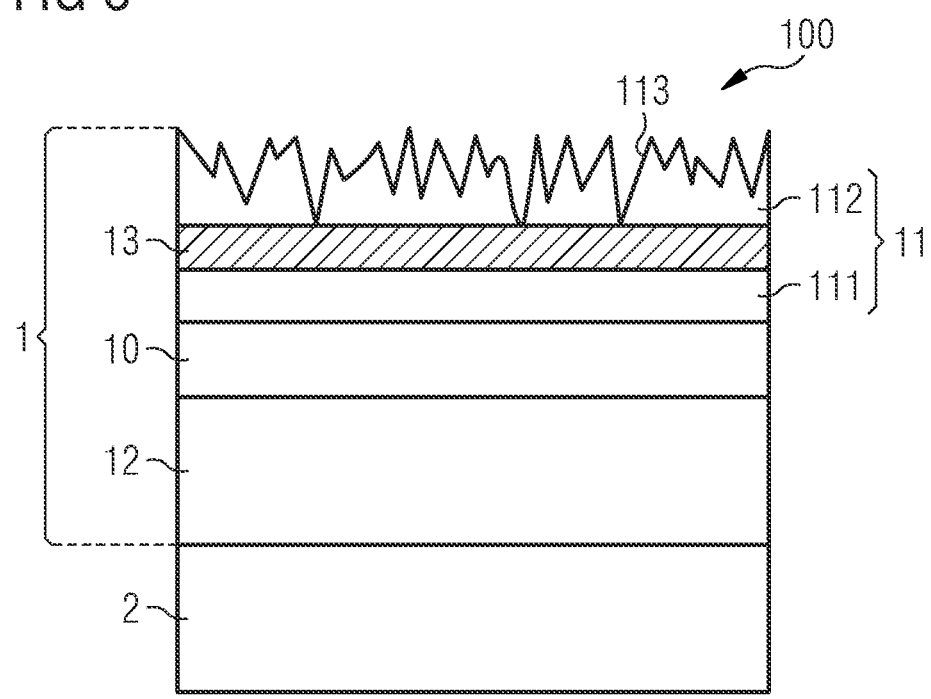

Further advantages, advantageous embodiments and further developments are revealed by the embodiments described below in connection with the figures, in which:

FIG. 1 shows a schematic illustration of a light-emitting semiconductor device according to an embodiment, FIG. 2 shows a schematic illustration of a light-emitting semiconductor device according to a further embodiment, FIG. 3 shows a schematic illustration of a light-emitting semiconductor device according to a further embodiment, FIG. 4 shows a schematic illustration of a light-emitting semiconductor device according to a further embodiment, and FIG. 5 shows a schematic illustration of a light-emitting semiconductor device according to a further embodiment.

In the embodiments and figures, identical, similar or identically acting elements are provided in each case with the same reference numerals. The elements illustrated and their size ratios to one another should not be regarded as being to scale, but rather individual elements, such as for example layers, components, devices and regions, may have been made exaggeratedly large to illustrate them better and/or to aid comprehension.

FIG. 1 shows an embodiment of a light-emitting semiconductor device 100 that has a semiconductor layer sequence 1 based on a phosphide and/or arsenide compound semiconductor material system. The light-emitting semiconductor device is embodied as an electroluminescent semiconductor device or as a photoluminescent semiconductor device. Accordingly, the semiconductor layer sequence 1 has at least a light-emitting semiconductor layer 10, which is embodied to emit 100 light during operation of the semiconductor device. Depending on the embodiment as an electroluminescent or photoluminescent semiconductor device, the excitation of the light-emitting semiconductor layer 10 for light generation can be effected by injecting an electric current or by optical excitation by means of an excitation light irradiated from outside. In particular, the light-emitting semiconductor component can thus be a light-emitting diode chip or an epitaxially grown converter, i.e., a so-called epi-converter.

The semiconductor layer sequence 1 can have as light-emitting semiconductor layer 10 for example a conventional pn junction, a double heterostructure, a single quantum well structure (SQW structure) or a multiple quantum well structure (MQW structure) and thus one or a plurality of suitable functional semiconductor layers. In addition, further functional layers and functional regions can be present, such as p- or n-doped charge carrier transport layers, undoped or p- or n-doped confinement, cladding, current spreading and/or waveguide layers, barrier layers, planarization layers, buffer layers, protection layers and/or electrode layers, as well as combinations thereof. Such layers, elements and structures for electroluminescent and photoluminescent semiconductor components are known to the expert in particular with regard to design and function and are therefore not explained in detail here.

Furthermore, for example for the effective confinement of charge carriers in the light-emitting semiconductor layer 10 the semiconductor layer sequence 1 has a first and a second cladding layer 11, 12, between which the light-emitting semiconductor layer 10 is arranged. The cladding layers 11, 12 preferably each comprise a semiconductor material with a higher band gap than the light-emitting semiconductor layer 10. In phosphide and arsenide compound semiconductor material systems this can be achieved in particular by a high aluminum content. For example, in the case of phosphide compound semiconductor material systems, cladding layers 11, 12 with or being made of $Al_{0.25}In_{0.25}P$ or even with even higher aluminum contents are advantageous. At least the first cladding layer 11 or both cladding layers 11, 12 can form outer layers of the semiconductor layer sequence 1 of the light-emitting semiconductor device 100 and thus face the atmosphere surrounding the semiconductor device 100. Depending on the embodiment of the light-emitting semiconductor device 100, the cladding layers 11, 12 can each be undoped, p-doped or n-doped.

However, due to the high aluminum content, there is a risk that a cladding layer can degrade slightly in a moisture- and/or oxygen-containing environment due to oxidation processes, which can result in a reduction in age stability and luminescence properties. Therefore, the semiconductor layer sequence 1 furthermore has at least a first semiconductor protection layer 13, which in the embodiment shown is arranged inside the first cladding layer 11. In other words, the first cladding layer 11 has a first sublayer 111 and a second sublayer 112, between which the first semiconductor protection layer 13 is located. The second sublayer 112 accordingly forms the outer layer of the first cladding layer 11 and thus an outer layer of the semiconductor device 100.

The first cladding layer 11 and the first semiconductor protection layer 13 comprise or are made of semiconductor materials of the same compound semiconductor material system. Accordingly, the first cladding layer 11 and the first semiconductor protection layer 13 each comprise or are made of a semiconductor material based on InAlGaP or based on InAlGaAs. The first semiconductor protection layer 13 has such a composition and thickness that the first semiconductor protection layer 13 is on the one hand permeable to the light generated in the light-emitting semiconductor layer 10 during operation and on the other hand is less strongly oxidized by moisture and/or oxygen compared to the first cladding layer 11. In view of these requirements, it is particularly advantageous if the first semiconductor protection layer 13 has an aluminum content which is lower than the aluminum content of the first cladding layer 11. In particular, the aluminum content can be more than 0% and less than 12%. In addition, it can be particularly advantageous if the first protection layer 13 has a thickness of greater than or equal to 10 nm and less than or equal to 100 nm, so that the first semiconductor protection layer 13 can, on the one hand, provide sufficient protection for the underlying semiconductor layers and, on the other hand, have sufficient transparency for the light generated in the light-emitting semiconductor layer 10.

FIG. 2 shows a light-emitting semiconductor device 100 according to a further embodiment, in which, in comparison to the previous embodiment, the first semiconductor protection layer 13 forms an outer layer of the semiconductor layer sequence 1. Accordingly, the first semiconductor protection layer 13 in this embodiment is arranged on a side of the first cladding layer 11 facing away from the light-emitting semiconductor layer 10. As already described in connection with the previous embodiment, compared to the first cladding layer 11 the first semiconductor protection layer 13 can be more stable against damaging environmental influences such as moisture and/or oxygen due to the lower aluminum content, so that the tendency to degradation of the semiconductor layer sequence 1 can be significantly reduced.

FIG. 3 shows a further embodiment of a light-emitting semiconductor device 100 which, like the embodiment described in connection with FIG. 1, has a first semiconductor protection layer 13 inside the first cladding layer 11 that is formed as an outer layer. Since, for example, in the case of the phosphide compound semiconductor material system, the refractive index of the outer layers can be very high at about 3.5, the optical outcoupling of light generated in the light-emitting semiconductor layer 10 during operation can be difficult. In order to increase the optical outcoupling, the light-emitting semiconductor device 100 shown in FIG. 3 has a roughening 113 on the outer side facing away from the light-emitting semiconductor layer 10. In other words, the first surface layer 11 thus comprises the roughening 113 in the second sublayer 112.

The roughening 113 can be produced by an etching process such as wet chemical etching and can thus be an etching structure with a large number of regularly and/or irregularly arranged elevations and depressions. In particular, the roughening can have a maximum structure depth of greater than or equal to 200 nm and less than or equal to 1 µm. With regard to efficient optical light extraction, a structure depth of greater than or equal to 500 nm can be particularly advantageous. The first cladding layer 11 is embodied in such a way that the second sublayer 112, which forms the outer surface, has a thickness which is greater than or equal to the maximum structural depth of the roughening 113. Thus it can be achieved that the pores in the semiconductor material of the first cladding layer 11 created by the roughening 113 only reach at most to the first semiconductor protection layer 13, but not further into the first cladding layer 11 and thus not, for example, to the light-emitting semiconductor layer 10. With conventional devices which do not have a semiconductor protection layer as described here, on the other hand, it can happen that pores are formed by the production of a roughening, which can extend into the active region, whereby during the production of the roughening and/or also in later operation in an atmosphere containing moisture and/or oxygen, oxidation processes can cause degradation in the active region and thus a deterioration of the luminescence properties.

With the aid of the first semiconductor layer 13, the stability and reliability of the light-emitting semiconductor device 100 can be increased, as already described in connection with the previous embodiments, even in the case of roughening or another comparable surface structure. For example, it has been shown that, due to the arrangement of a first semiconductor protection layer 13 of $Al_{0.06}Ga_{0.18}In_{0.26}P$, about 10 nm thick, into a first cladding layer 11 of AlInP, the conversion efficiency of a semiconductor light-emitting device 100 embodied as an epi-converter according to the embodiment of FIG. 3, which converts blue light into red light, could be increased from 1.5% to 37% without the use of an additional lens and even up to 50% when using an additional lens.

FIG. 4 shows a further embodiment for a light-emitting semiconductor device 100, in which the semiconductor layer sequence 1, in comparison with the embodiment in FIG. 3, additionally has a second semiconductor protection layer 14 on a side of the light-emitting semiconductor layer 10 opposite the first semiconductor protection layer 13. In particular, the second semiconductor protection layer 14 can be embodied in the same way as the first semiconductor protection layer 13 or in a way similar to the first semiconductor protection layer 13. In particular, both semiconductor protection layers 13, 14 can be based on the same semiconductor material.

The second semiconductor protection layer 14 is arranged, as a further outer layer, directly on the second cladding layer 12 on a side facing away from the light-emitting semiconductor layer 10. This allows the second semiconductor protection layer 14 to have, on the side opposite the first semiconductor protection layer 13, the protective function described in connection with the first semiconductor protection layer 13 in the previous embodiments. The use of two semiconductor protection layers can be advantageous, especially in the case of light-emitting semiconductor components embodied as epi-converters, in which it is necessary to remove the growth substrate after the growth of semiconductor layer sequence 1, and in which, for example, compared with light-emitting diodes there is no current spreading layer which is typically 1 to 2 µm thick.

FIG. 5 shows a further embodiment of a light-emitting semiconductor device 100, in which the semiconductor layer sequence 1 is arranged, with a side facing away from the first semiconductor protection layer 13, on a substrate 2. As substrate materials semiconductor materials such as GaAs, GaP, Ge or Si can be suitable. For example, the substrate 2 can be a growth substrate on which the semiconductor layer sequence 1 has been grown. Furthermore, the substrate 2 can also be a carrier substrate to which the semiconductor layer sequence 1 has been transferred after having been grown on a growth substrate. In particular, the semiconductor device 100 shown can be a light-emitting diode chip which, in addition to the layers and elements shown, can have further layers and elements customary for light-emitting diode chips, for example in particular electrical contact layers such as electrode layers for making electrical contact with the semiconductor device 100.

In the light-emitting semiconductor devices described here, the use of the first semiconductor protection layer and, where applicable, the additional use of the second semiconductor protection layer in the manner described above can lead to an increase in stability, since, due to the lower aluminum content of the semiconductor protection layers compared to the cladding layers, ageing due to oxidation processes in environments containing oxygen and/or moisture can be significantly reduced or even completely avoided. The described use of the additional semiconductor protection layer(s) with an increased resistance to damaging environmental conditions can thus result in advantages, above all improved luminescence properties and better ageing stability, since it can be avoided in particular that moisture and/or other damaging substances from the environment can damage the light-emitting semiconductor layer through oxidation processes.

The features and embodiments described in connection with the figures can also be combined with one another, even if not all such combinations are explicitly described. Furthermore, the embodiments described in connection with the figures may have additional and/or alternative features according to the description in the general part.

The features and embodiments described in connection with the figures can also be combined with one another according to further embodiments, even if not all such combinations are explicitly described. Furthermore, the embodiments described in connection with the figures can have additional and/or alternative features according to the description in the general part.

REFERENCE NUMERALS 1 semiconductor layer sequence
2 substrate
10 light-emitting semiconductor layer
11 first cladding layer
12 second cladding layer
13 first semiconductor protection layer
14 second semiconductor protection layer
100 semiconductor device
111 sublayer
112 sublayer
113 roughening

The invention claimed is:

1. A light-emitting semiconductor device having a semiconductor layer sequence based on a phosphide and/or arsenide compound semiconductor material system, wherein
the semiconductor layer sequence comprises a light-emitting semiconductor layer, which is embodied to emit light during operation of the semiconductor device, between a first cladding layer and a second cladding layer, and at least one first semiconductor protection layer,
the first semiconductor protection layer is arranged inside the first cladding layer, wherein the first cladding layer is formed as an outer layer, or the first semiconductor protection layer is arranged as an outer layer directly on the first cladding layer on a side remote from the light-emitting semiconductor layer,
the first semiconductor protection layer has a lower aluminum content than the first cladding layer, and
the first semiconductor protection layer has an aluminum content of more than 0% and less than 12%.

2. The semiconductor device according to claim 1, wherein the first cladding layer and the first semiconductor protection layer comprise semiconductor materials of the same compound semiconductor material system.

3. The semiconductor device according to claim 1, wherein the first semiconductor protection layer has a thickness of less than or equal to 100 nm.

4. The semiconductor device according to claim 1, wherein the first semiconductor protection layer is transparent to the light generated in the light-emitting semiconductor layer during operation of the semiconductor device.

5. A light-emitting semiconductor device having a semiconductor layer sequence based on a phosphide and/or arsenide compound semiconductor material system,
wherein
the semiconductor layer sequence comprises a light-emitting semiconductor layer, which is embodied to emit light during operation of the semiconductor device,
between a first cladding layer and a second cladding layer, and at least one first semiconductor protection layer,
the first semiconductor protection layer is arranged inside the first cladding layer, wherein the first cladding layer is formed as an outer layer,
the first semiconductor protection layer has a lower aluminum content than the first cladding layer, and
the first cladding layer has a roughening on an outer surface remote from the light-emitting semiconductor layer.

6. The semiconductor device according to claim 5, wherein the roughening has a maximum structure depth of greater than or equal to 200 nm and less than or equal to 1 µm.

7. The semiconductor device according to claim 1, wherein the semiconductor layer sequence comprises a second semiconductor protection layer on a side of the light-emitting semiconductor layer opposite to the first semiconductor protection layer.

8. The semiconductor device according to claim 7, wherein the second semiconductor protection layer is arranged as a further outer layer directly on the second cladding layer on a side remote from the light-emitting semiconductor layer.

9. The semiconductor device according to claim 7, wherein the first and second semiconductor protection layers are based on the same semiconductor material.

10. The semiconductor device according to claim 1, wherein the semiconductor layer sequence is arranged, with a side facing away from the first semiconductor protection layer, on a substrate.

11. The semiconductor device according to claim 10, wherein the substrate is a growth substrate on which the semiconductor layer sequence is grown.

12. The semiconductor device (100) according to claim 1, wherein the light-emitting semiconductor device is an electroluminescent semiconductor device.

13. The semiconductor device according to claim 1, wherein the light-emitting semiconductor device is a photoluminescent semiconductor device.

14. The semiconductor device according to claim 5, wherein the roughening does not extend through the first semiconductor protection layer.

* * * * *